United States Patent
Pan

(10) Patent No.: US 8,933,519 B2
(45) Date of Patent: Jan. 13, 2015

(54) MAGNETIC DYNAMIC RANDOM ACCESS NONVOLATILE SEMICONDUCTOR MEMORY (MRAM)

(71) Applicant: James Nan Hsi Pan, Hanover, MD (US)

(72) Inventor: James Nan Hsi Pan, Hanover, MD (US)

(73) Assignee: James N. Pan, Hanover, MD (US)

( * ) Notice: Subject to any disclaimer, the term of this patent is extended or adjusted under 35 U.S.C. 154(b) by 35 days.

(21) Appl. No.: 13/873,852

(22) Filed: Apr. 30, 2013

(65) Prior Publication Data

US 2014/0319589 A1 Oct. 30, 2014

(51) Int. Cl.
*H01L 21/02* (2006.01)
*H01L 27/088* (2006.01)
*H01L 43/02* (2006.01)

(52) U.S. Cl.
CPC .................................. *H01L 43/02* (2013.01)
USPC .......................................... 257/401; 257/295

(58) Field of Classification Search
CPC ....... H01L 43/02; G11C 11/02; G11C 11/412
USPC ..................................................... 257/401, 295
See application file for complete search history.

(56) References Cited

U.S. PATENT DOCUMENTS 7,812,383 B2 * 10/2010 Inokuchi et al. ............... 257/295

* cited by examiner

*Primary Examiner* — Tu-Tu Ho

(57) ABSTRACT

The present invention is for a novel semiconductor transistor memory (MRAM) specifically designed to interact with magnetic field generating devices. The function of the transistor can be affected by the magnetic fields. Storage of electronic information is achieved by rotations of the devices in the system.

4 Claims, 10 Drawing Sheets

Traditional MOSFET:

Circular or "Ω" shape MOSFET:

MAGNETIC DYNAMIC RANDOM ACCESS NONVOLATILE SEMICONDUCTOR MEMORY (MRAM)

The present invention describes a circular MOSFET that can rotate in the magnetic fields from the metal loops that can also rotate directly above and underneath the MOSFET.

The motion of the MOSFET and the metal loops can cause a different electric current flowing in the MOSFET. Data storage can be achieved by sensing such a difference.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention provides a nonvolatile memory device. A circular MOSFET that can rotate or spin in response to the magnetic fields. Metal loops are directly above and underneath the MOSFET. The distance between the loop and the MOSFET can be only a few nanometers (width of a few atoms). These metal loops can also rotate or spin in the magnetic fields. The MOSFET and metal loops can be in contact with each other so the electric current in the MOSFET will change. Memory function is achieved by sensing the difference in the electric current.

DETAILED DESCRIPTION OF THE INVENTION

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

Figure 2:
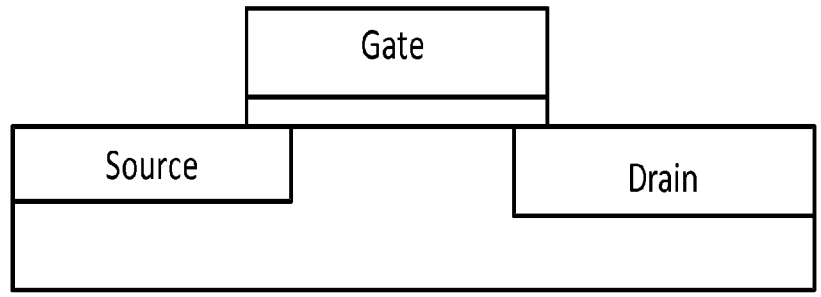
FIG. 2 shows an conventional MOSFET (Metal Oxide Semiconductor Field Effective Transistor), invented before. (An example is U.S. Pat. No. 8,412,487 (United State patent)) A round or "Ω" shape MOSFET can be formed by extending the gate length of a traditional MOSFET.
Figure 2:
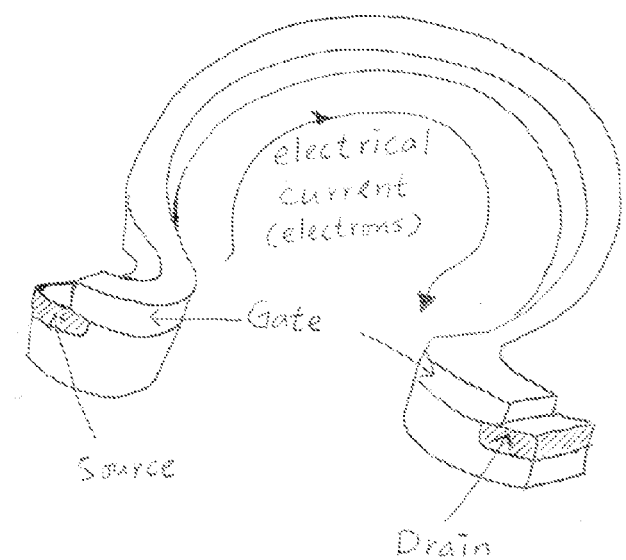
Figure 3:
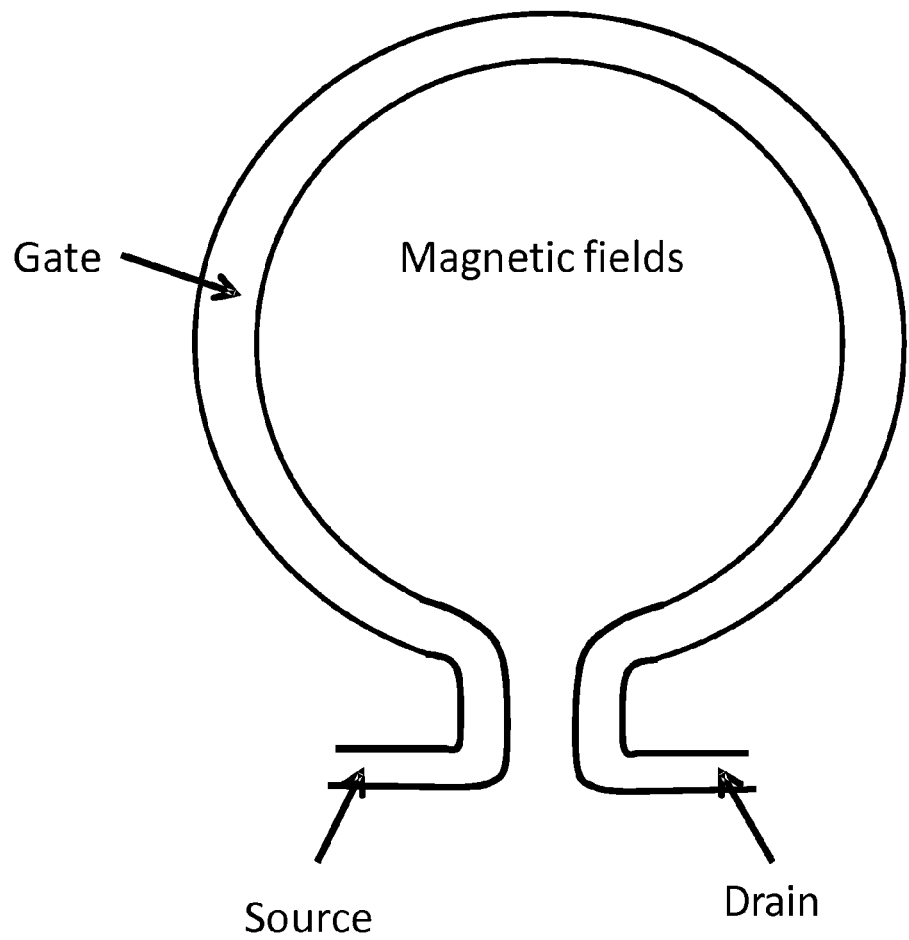
FIG. 3 shows a circular or "Ω" shape MOSFET (top down view).

A MOSFET, invented in the 1960's, is a "Metal Oxide Semiconductor Field Effect Transistor" (described in FIG. 2). It consists of 4 regions: gate, source, drain and substrate. The gate is a conductor. The source and drain are heavily doped conducting semiconductor regions. The gate is separated from the substrate by a layer of insulator, such as silicon dioxide. A reference of a MOSFET can be seen in U.S. Pat. No. 8,412,487 (United State patent).

A MOSFET can also be constructed as a "loop", or in an "Ω" shape, as shown in FIG. 2.

Figure 4:
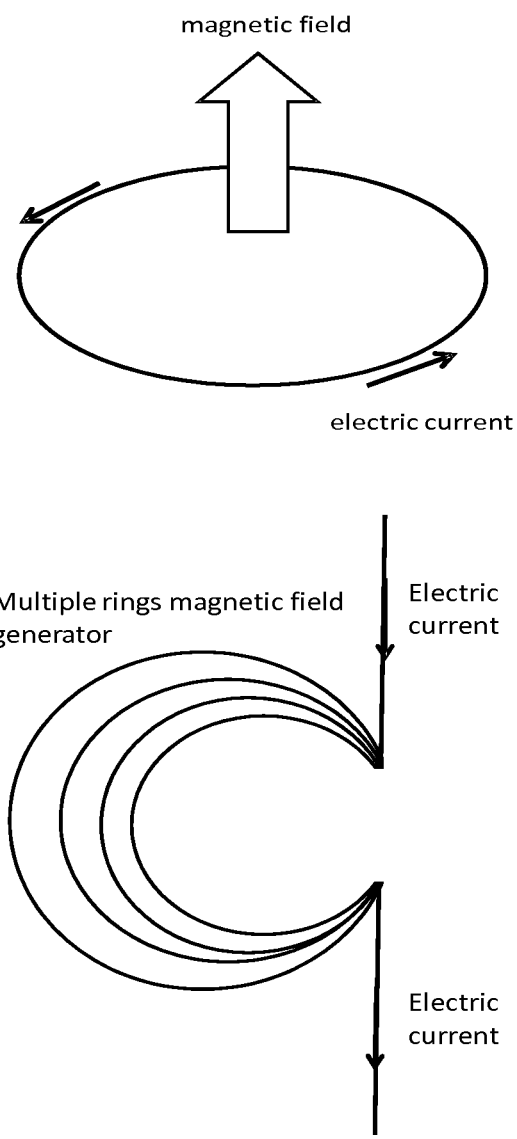
FIG. 4 shows how magnetic fields are generated by a metal loop where electrical current flows.

FIG. 4 explains how static magnetic fields can be generated from a metal loop, where electrical current flows. This is the so called "Gauss Law" in Physics. When electrical current flows in a metal loop, magnetic fields are produced.

Figure 5:
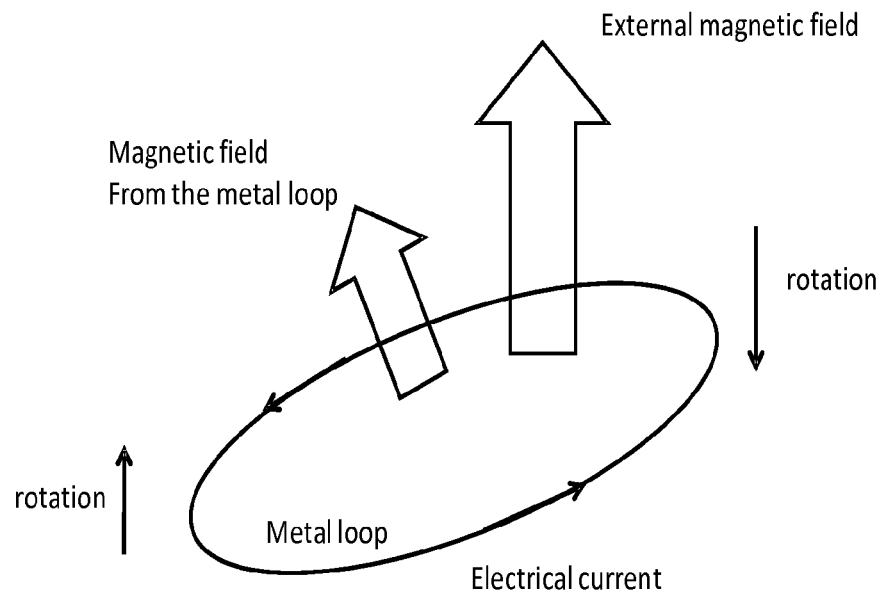
FIG. 5 explains how a metal loop with electrical current flowing in it rotates in an external magnetic field.
Figure 5:
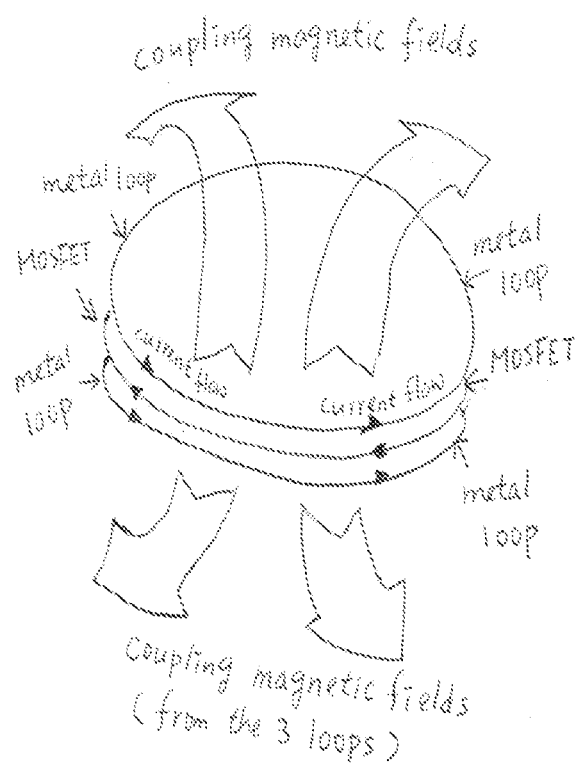

If the system in FIG. 4 is in an external magnetic field, the metal loop with electrical current will rotate, influenced by the direction of the external magnetic field. This is explained in FIG. 5.

Figure 1:
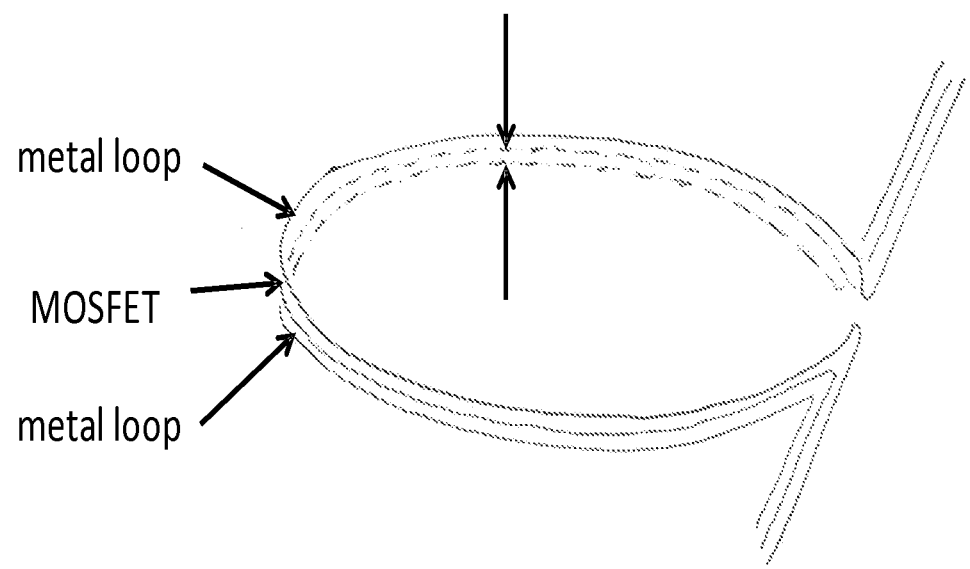
FIG. 1 describes the nonvolatile memory with the circular MOSFET in the center and magnetic field generating loops closely above and underneath the MOSFET.

In FIG. 1, the 3 loops are directly on top of one another. The distance between the loops is of atomic scale—only a few nanometers. The MOSFET is sandwiched by two electrical current conducting metal loops. There is a specific magnetic field produced by each of the 3 loops. The loops rotate in response to the magnetic fields. The electrical current flowing in the loops become different when the rotation happens and when the loops become in contact with the MOSFET.

Figure 6:
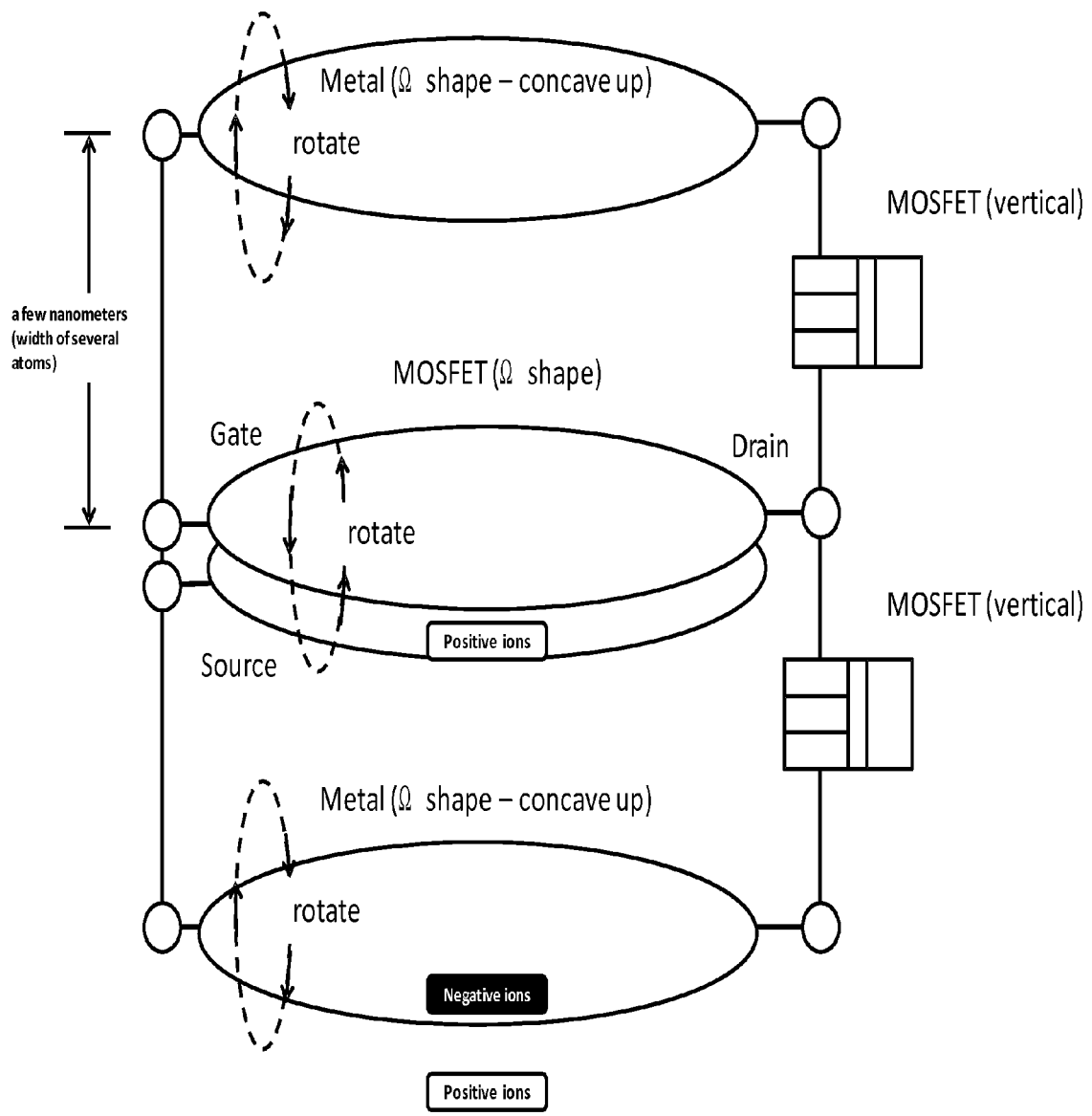
FIG. 6 describes the same nonvolatile memory device as in FIG. 1 with more details.

FIG. 6 shows more details of the device. Connecting devices (in small open circles) are specially designed to allow the loops (including the MOSFET) to rotate in the magnetic fields separately. Vertical MOSFETs (to the right) provide additional switching capability to the memory operations.

Figure 7:
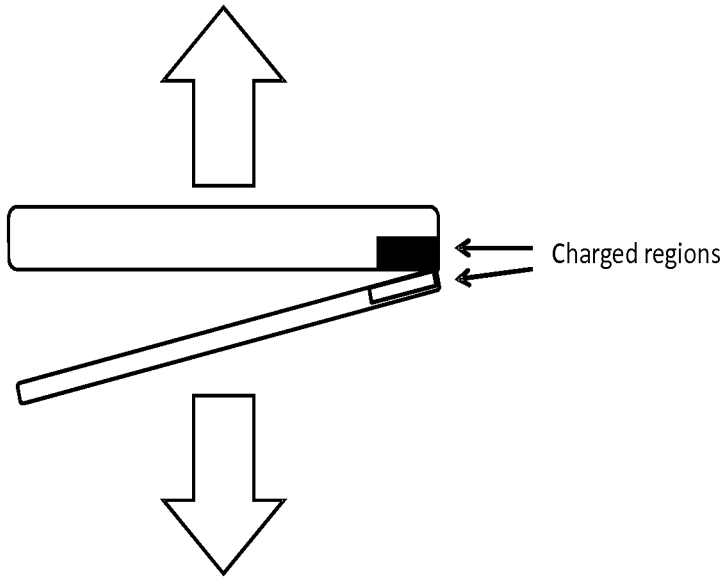
FIG. 7 explains how the loops are in contact with each other as influenced by the magnetic fields.
Figure 7:
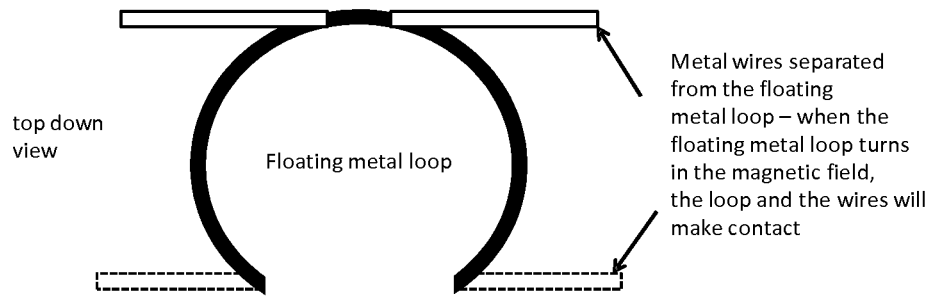
Figure 7:
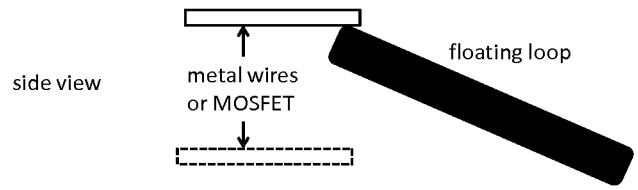

FIG. 7 shows how the loops rotate with the magnetic field and can literally be in contact with other loops or the MOSFET. The charged areas in each loop and in the MOSFET provide static electrical attractive or repulsive forces, so the loops and the MOSFET can be either in contact with one another or totally be separated, depending on the magnetic fields.

Figure 8:
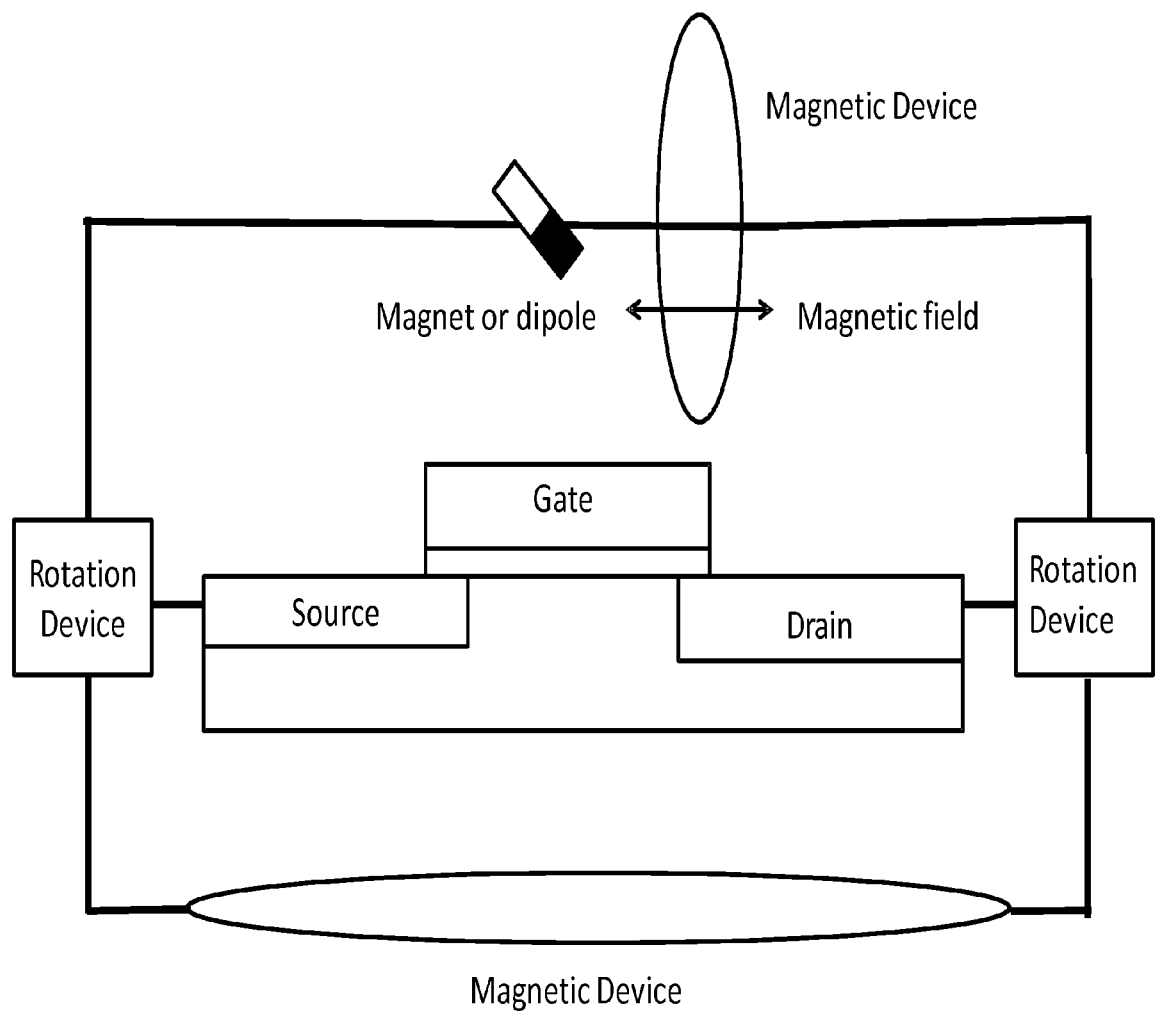
FIG. 8 shows how magnet or a dipole is installed and affected by the magnetic fields.

A dipole, or a magnet, can be placed in the magnetic fields to provide memory functions. This is illustrated in FIG. 8.

Figure 9:
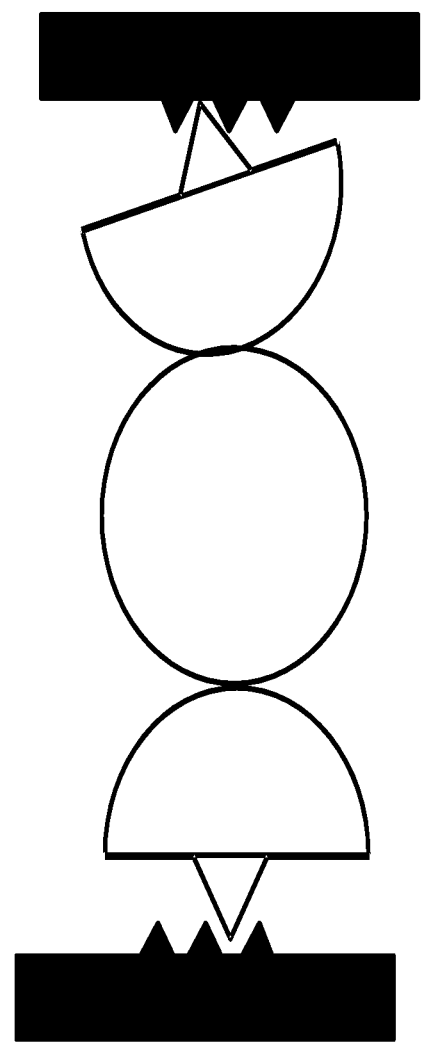
FIG. 9 shows how a connecting device is made.

FIG. 9 shows how connecting devices are specially designed to allow rotation movements of each loop and the MOSFET.

Figure 10:
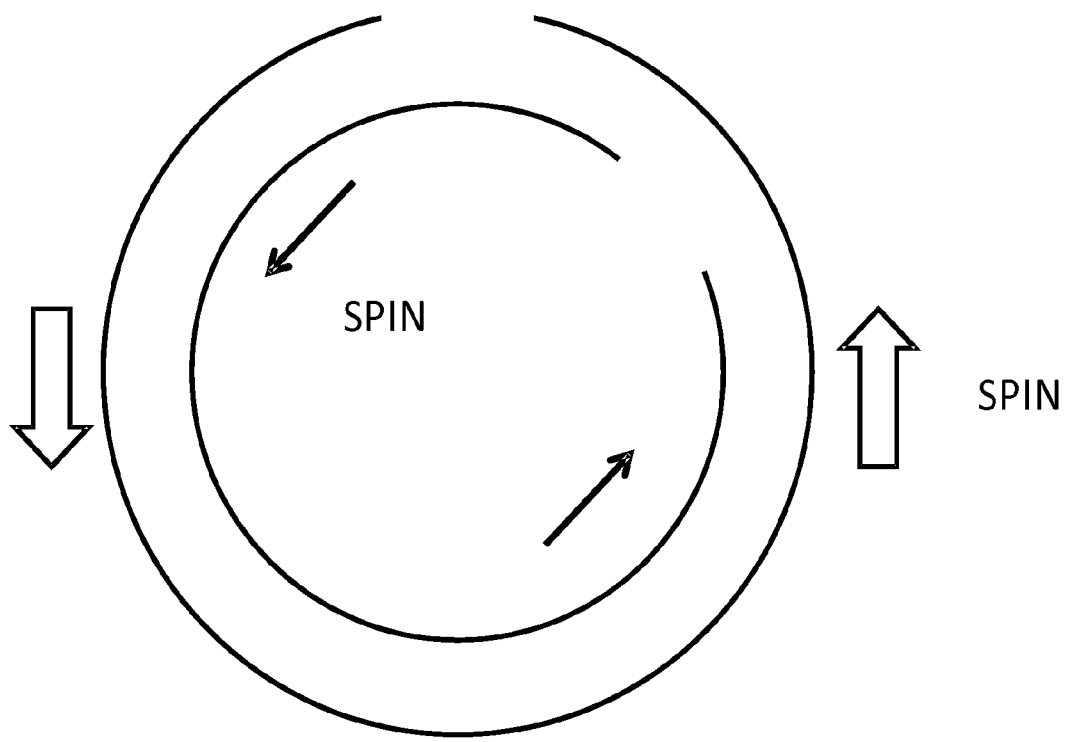
FIG. 10 describes how the loops spin to achieve memory functions.

FIG. 10 describes a multiple-loop device where the loops may spin clockwise or counter clockwise in response to magnetic or electrical fields. The spin angle can affect the electrical functioning of the MOFET for memory operations.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

The invention claimed is:

1. A magnetic nonvolatile memory comprising:
multiple loops in parallel to one another, the multiple loops in the basic case comprising 3 loops: loop 1 being a circular MOSFET sandwiched by loop 2 and loop 3, which are composed of electrical current conducting materials, and the 3 loops being configured to rotate or spin in response to the magnetic fields generated by the three loops, and vertical MOSFETs and rotation devices integrated at the two ends of the three loops.

2. The nonvolatile memory of claim 1, wherein a magnet or charged dipole is installed within the range of the magnetic fields and the movement of the magnet or dipole is monitored by a built-in optic sensor.

3. The magnetic nonvolatile memory of claim 1, wherein charged regions (positive and negative charges) are installed as part of the three or multiple loops and MOSFETs to provide static attractive and repulsive forces.

4. The magnetic nonvolatile memory of claim 1, wherein the magnetic device comprises an array of magnetic generating devices or loops to form patterns of magnetic fields above, through and under the MOSFET.

\* \* \* \* \*